(12) United States Patent
Fukuzumi et al.

(10) Patent No.: US 9,129,860 B2
(45) Date of Patent: Sep. 8, 2015

(54) SEMICONDUCTOR DEVICE AND MANUFACTURING METHOD THEREOF

(71) Applicant: Kabushiki Kaisha Toshiba, Minato-ku (JP)

(72) Inventors: Yoshiaki Fukuzumi, Yokkaichi (JP); Hideaki Aochi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/142,138

(22) Filed: Dec. 27, 2013

(65) Prior Publication Data

US 2014/0284607 A1    Sep. 25, 2014

(30) Foreign Application Priority Data

Mar. 25, 2013  (JP) ................. 2013-061638

(51) Int. Cl.
   *H01L 27/24*   (2006.01)
   *H01L 27/115*  (2006.01)
   *G11C 16/04*   (2006.01)

(52) U.S. Cl.
   CPC ...... *H01L 27/11582* (2013.01); *G11C 16/0483* (2013.01); *H01L 27/1157* (2013.01); *H01L 27/2481* (2013.01)

(58) Field of Classification Search
   CPC ............ H01L 27/2481; H01L 27/1157; H01L 27/2463; H01L 27/0688
   See application file for complete search history.

(56) References Cited

U.S. PATENT DOCUMENTS

| | | | |
|---|---|---|---|
| 7,936,004 | B2 | 5/2011 | Kito et al. |
| 8,154,068 | B2 | 4/2012 | Katsumata et al. |
| 8,350,326 | B2 | 1/2013 | Fukuzumi et al. |
| 8,372,720 | B2 | 2/2013 | Fukuzumi et al. |
| 8,455,940 | B2 | 6/2013 | Lee et al. |
| 2010/0202206 | A1 | 8/2010 | Seol et al. |
| 2011/0127597 | A1 | 6/2011 | Fukuzumi et al. |

FOREIGN PATENT DOCUMENTS

| | | |
|---|---|---|
| JP | 2009-146954 | 7/2009 |
| JP | 2010-21390 | 1/2010 |
| JP | 2010-161132 | 7/2010 |
| JP | 2010-187000 | 8/2010 |
| JP | 2011-204713 | 10/2011 |
| JP | 2011-249803 | 12/2011 |

*Primary Examiner* — Thanh V Pham
(74) *Attorney, Agent, or Firm* — Oblon, McClelland, Maier & Neustadt, L.L.P.

(57) ABSTRACT

In this embodiment, a mask material is formed above a film to be processed, and a plurality of sacrifice films are formed above the mask material, each of the sacrifice films having a columnar shape. Then, a sidewall film is formed on a sidewall of the sacrifice films, and then the sacrifice films are removed. Thereafter, the sidewall films are caused to flow. In addition, a plurality of holes are formed in the mask material using the sidewall film as a mask. Then, isotropic etching is performed for the mask material to etch back the sidewall of the mask material with respect to a sidewall of the sidewall film by a first distance. Thereafter, a deposition layer is deposited inside the plurality of holes to close an opening of the plurality of holes with the deposition layer. Anisotropic etching is conducted to remove the deposition layer in the opening.

4 Claims, 17 Drawing Sheets

SEMICONDUCTOR DEVICE AND MANUFACTURING METHOD THEREOF

CROSS REFERENCE TO RELATED APPLICATIONS

This application is based on and claims the benefit of priority from prior Japanese Patent Application No. 2013-61638, filed on Mar. 25, 2013, the entire contents of which are incorporated herein by reference.

FIELD

Embodiments described herein relate to a semiconductor device and a method of manufacturing the same.

BACKGROUND

In a semiconductor device, e.g., a semiconductor memory device, a device where many holes penetrating through stacked films are formed is known. In miniaturization of semiconductor devices, it is required not only to reduce a line width and a pitch of wirings, but also to reduce a diameter of these plural holes and an arrangement pitch thereof. However, when aiming such miniaturization, there is a problem that variation in diameter of holes becomes remarkable.

BRIEF DESCRIPTION OF THE DRAWINGS

FIG. 4 is plan view illustrating a shape of word line conductive layer 41a.

DETAILED DESCRIPTION

In a method of manufacturing a semiconductor device according to the embodiments described below, a mask material is formed above a film to be processed, and a plurality of sacrifice films are formed above the mask material, each of the sacrifice films having a columnar shape. Then, a sidewall film is formed on a sidewall of the sacrifice films, and then the sacrifice films are removed. Thereafter, the sidewall films are caused to flow. In addition, a plurality of holes are formed in the mask material using the sidewall film as a mask. Then, isotropic etching is performed for the mask material to etch back the sidewall of the mask material with respect to a sidewall of the sidewall film by a first distance. Thereafter, a deposition layer is deposited inside the plurality of holes to close an opening of the plurality of holes with the deposition layer. Anisotropic etching is conducted to remove the deposition layer in the opening.

Hereinafter, a non-volatile semiconductor memory device according to embodiments a method of manufacturing the same will be explained with reference to the drawings. Note that the dimensions figures submitted with this specification may be illustrated differently from those of actual products, for convenience of explanation. This does not mean that dimensions are limited to those illustrated.

First Embodiment

Schematic Structure

First, with reference to FIG. 1, explanation on the schematic structure of the non-volatile semiconductor memory device (NAND type flash memory of the three-dimensional type) according to the first embodiment will be explained.

Figure 1:
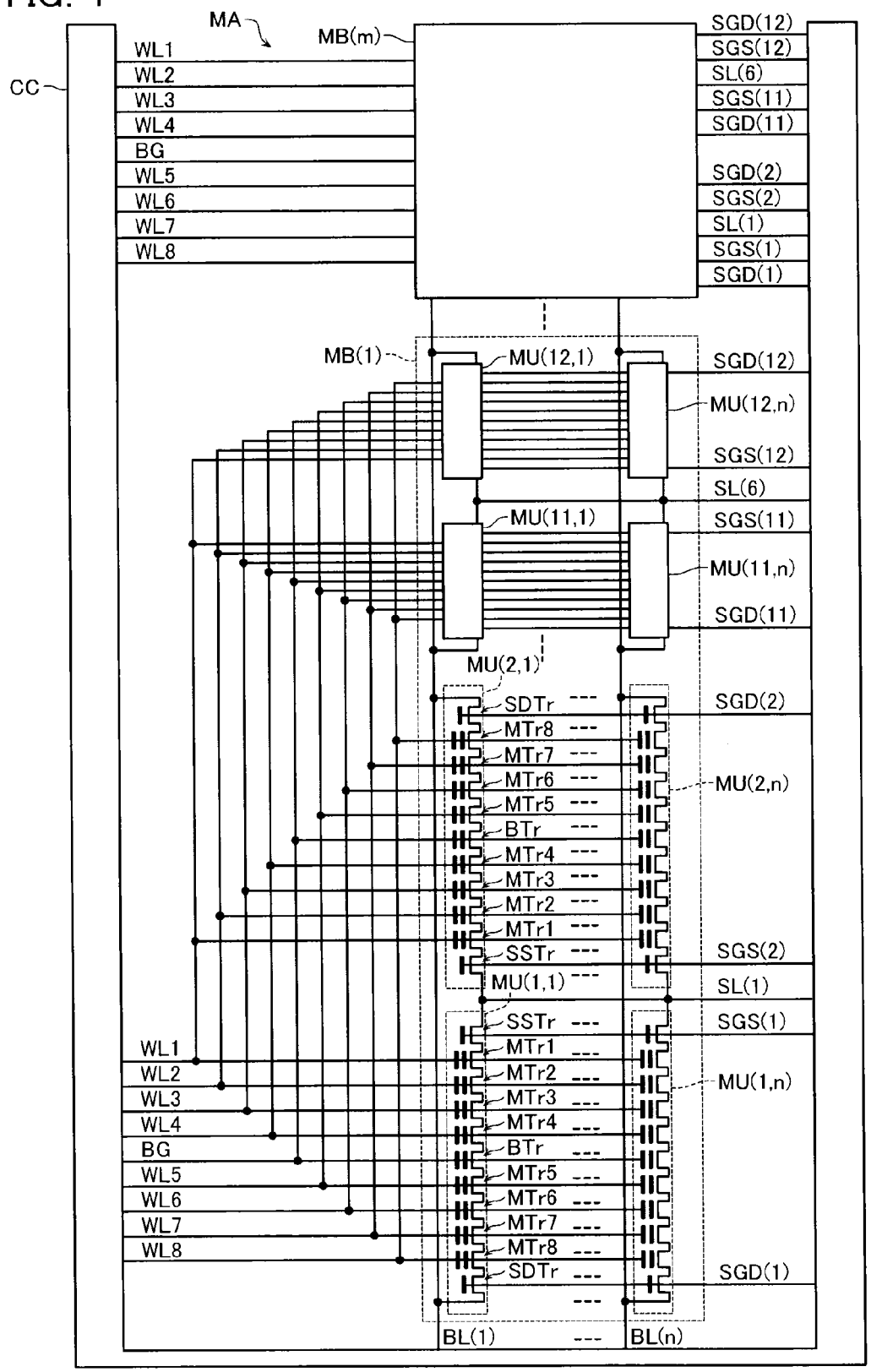
FIG. 1 is a circuit diagram illustrating a schematic structure of the non-volatile semiconductor memory device (NAND type flash memory of three-dimensional type) according to h the first embodiment.

The non-volatile semiconductor memory device according to the first embodiment comprises a memory cell array MA and a control circuit CC, as shown in FIG. 1. The control circuit CC controls a signal to be supplied to the memory cell array 1.

The memory cell array MA includes m pieces of memory blocks MB (1), . . . MB (m), as shown in FIG. 1. Note that when all memory blocks MB (1), . . . MB (m) are collectively called herein, they may be described as "memory blocks MB".

Each memory block MB has memory units MU (1, 1)-MU (12, n) arranged in a matrix form of n lines and 12 columns. The n lines and 12 columns are merely an example, and the number of lines and columns are not limited to this example.

Note that all memory units MU (1, 1)-MU (12, n) are collectively called herein, they may be described as "memory units MU".

The memory unit MU includes a memory string MS, a source-side select transistor SSTr and a drain-side select transistor SDTr.

The memory string MS is configured by serially-connecting memory transistors MTr1-MTr8 and a back gate transistor BTr, as shown in FIG. 1. The memory transistors MTr1-MTr4 and the memory transistors MTr5-MTr8 are each connected in series. The back gate transistor BTr is connected between the memory transistor MTr4 and the memory transistor MTr5.

The memory transistors MTr1-MTr8 each store charges in its charge storing layer to change its threshold voltage, and hold data according to this threshold voltage. The back gate transistor BTr is brought to a conductive state at least when its memory string MS is selected as a target of operation.

In each of the memory block MB (1)-MB (m), the memory transistors MTr1-MTr8 arranged in n lines and 12 columns have their gates commonly connected to word lines WL1-WL8. A back gate line BG is commonly connected to gates of the back gate transistors BTr arranged in n lines and 12 columns. A drain of the source-side select transistor SSTr is connected to a source of the memory transistor MTr1. A source line SL (1) is commonly connected to sources of the source-side select transistors SSTr located in the first column and the second column in the memory block MB. This is similarly applied to the third line and the other lines. For example, a source line SL (6) is commonly connected to sources of the source-side select transistors SSTr located in the eleventh column and the twelfth column in the memory block MB. Note that when all source lines SL (1)-SL (6) are collectively called herein, they may be described as "source lines SL".

Here, the control circuit CC of the first embodiment performs control for commonly connecting source lines SL (1)-SL (6) according to various operations (a write operation, a reading operation, an erase operation). The details of the structure and the control will be described later.

Also, a source-side selection gate line SGS (1) is connected to gates of the source-side select transistors SSTr located in the first column of the memory block MB. This is similar in the second column and the other columns. For example, a source-side selection gate line SGS (12) is connected to gates of the source-side select transistors SSTr located in the twelfth column of the memory block MB. When all source-side selection gate lines SGS (1)-SGS (12) are collectively called herein, they may be described as "source-side selection gate lines SGS".

A source of the drain-side select transistor SDTr is connected to a drain of the memory transistor MTr8. A bit line BL (1) is connected to drains of the drain-side select transistors SDTr located in the first line in the memory block MB. This is similar in the second line and the other lines. For example, a bit line BL (n) is connected to drains of the drain-side select transistors SDTr located in the n-th line of the memory block MB. The bit lines BL (1)-BL (n) are formed to cross the plural memory blocks MB. When all bit lines BL (1)-BL (n) are collectively called herein, they may be described as "bit lines BL".

Also, a drain-side selection gate line SGD (1) is connected to gates of the drain-side select transistors SDTr located in the first column of the memory block MB. This is similar in the second column and the other columns. For example, a drain-side selection gate line SGD (12) is connected to gates of the drain-side select transistors SDTr located in the twelfth line in the memory block MB. When all drain-side selection gate lines SGD (1)-SGD (12) are collectively called herein, they may be described as "drain-side selection gate lines SGD".

[Stacking Structure of Memory Block MB]

Figure 2:
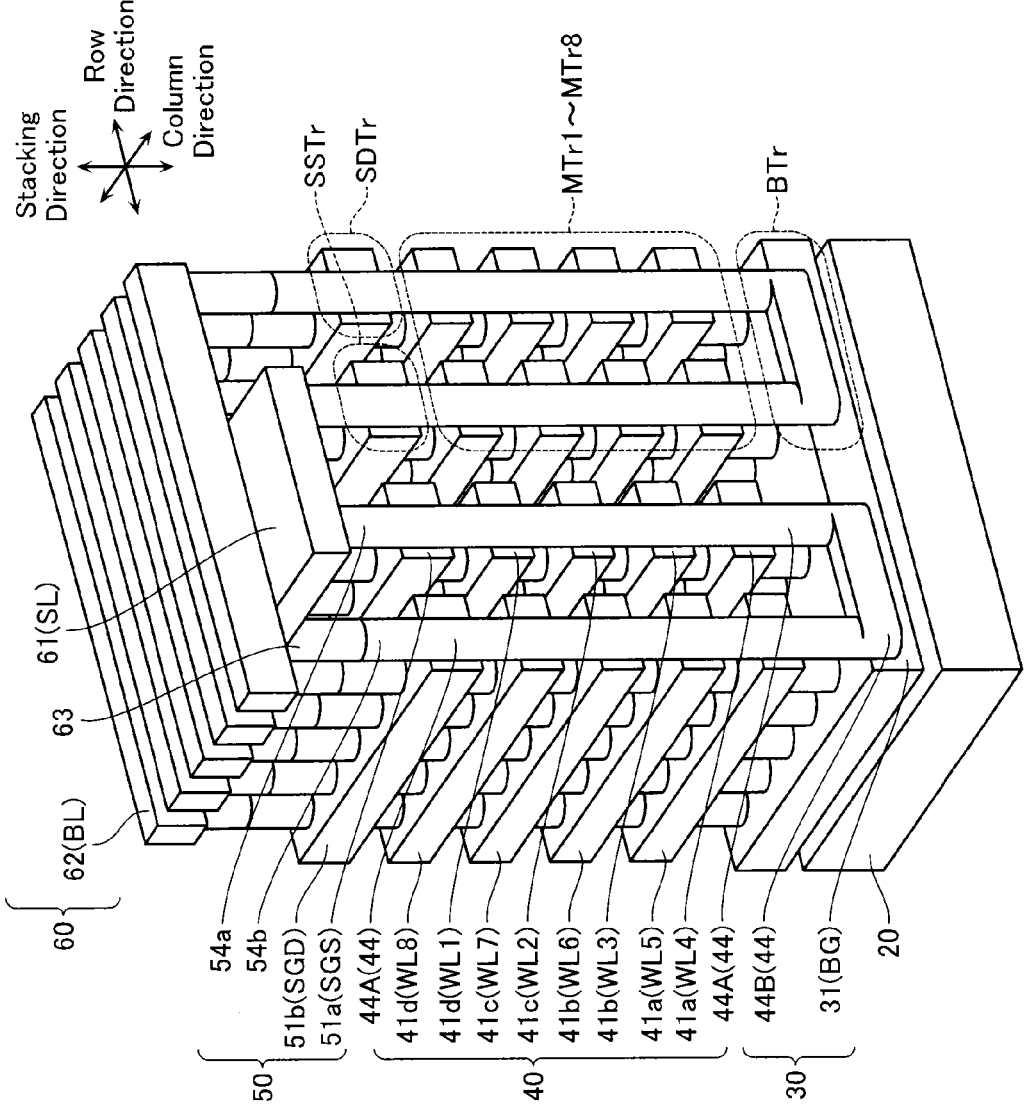
FIG. 2 is a perspective view illustrating the stacking structure of a memory block MB according to the first embodiment.
Figure 3:
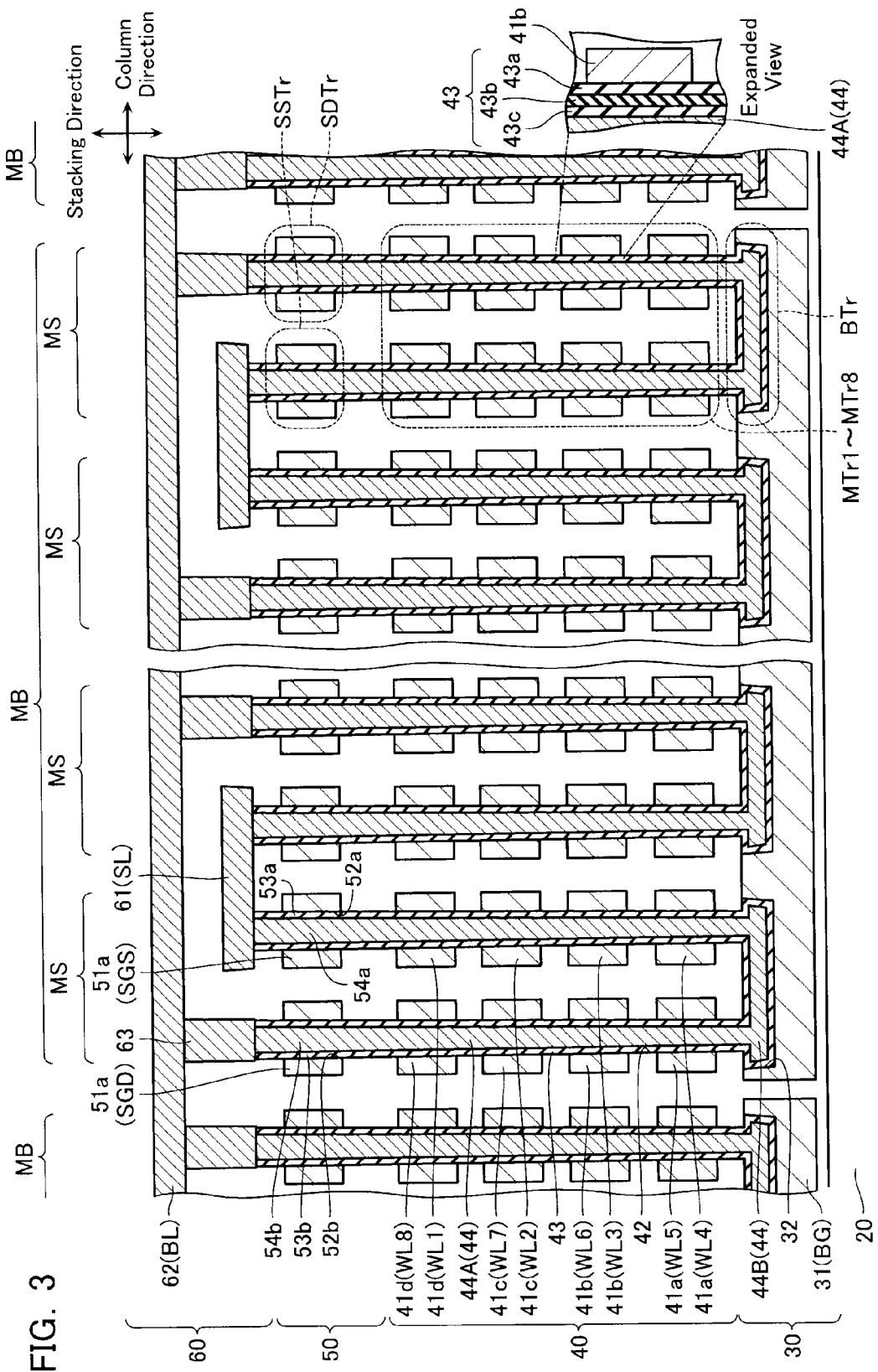
FIG. 3 is a schematic cross-sectional view illustrating a stacking structure of a memory block MB according to the first embodiment.

Next, with reference to FIG. 2 and FIG. 3, a stacking structure of the memory block MB according to the first embodiment will be described. FIG. 2 is a perspective view of the memory block MB. FIG. 3 illustrates a cross sectional view of the memory block MB. Note that FIG. 2 representatively illustrates a part of the memory block MB. The entire of the memory block MB has a shape where a structure shown in FIG. 2 is repeatedly formed in the column direction and the row direction.

As shown in FIG. 2 and FIG. 3, the memory block MB includes a back gate layer 30, a memory layer 40, a select transistor layer 50 and a wiring layer 60, which are sequentially stacked on a substrate 20. The back gate layer 30 functions as back gate transistors BTr. The memory layer 40 functions as memory transistors MTr1-MTr8. The select transistor layer 50 functions as the drain-side select transistors SDTr and the source-side select transistors SSTr. The wiring layer 60 functions as source lines SL and bit lines BL.

The back gate layer 30 includes, as shown in FIG. 2 and FIG. 3, a back gate conductive film 31. The back gate conductive film 31 functions as the back gate line BG and a gate of the back gate transistors BTr. The back gate conductive film 31 is formed to spread in a plate-like shape and two-dimensionally, i.e. in a row direction and a column direction parallel to the substrate 20. For example, a back gate conductive film 31 uses polysilicon (poly-Si) as a material thereof.

The back gate layer 30 includes, as shown in FIG. 3, a memory gate insulating film 43 and a coupling semiconductor layer 44B. The memory gate insulating film 43 is provided between the coupling semiconductor layer 44B and the back gate conductive film 31. The coupling semiconductor layer 44B functions as a body (a channel) of the back gate transistor BTr. The coupling semiconductor layer 44B is formed to dig the back the gate conductive film 31. The coupling semiconductor layer 44B is formed to have a rectangle-like shape having a column direction as a lengthwise direction when seen from the top surface. The coupling semiconductor layers 44B are formed in matrix in the row direction and the column direction in one memory block MB. The coupling semiconductor layer 44B uses polysilicon (poly-Si) as a material thereof.

The memory layer 40 is formed on the upper side of the back gate layer 30. The memory layer 40 has four word line conductive layers 41a-41d. The word line conductive layer 41a functions as the word line WL4 and a gate of the memory transistor MTr4. Also, the word line conductive layer 41a functions as the word line WL5 and a gate of the memory transistor MTr5. Similarly, the word line conductive layers 41b-41d each function as any one of the word lines WL1-WL3 and gates of the memory transistors MTr1-MTr3. Also, the word line conductive layers 41b-41d each function as any one of the word lines WL6-WL8 and gates of the memory transistors MTr6-MTr8.

The word line conductive layers 41a-41d are stacked with interlayer insulating layers (not shown) sandwiched therebetween. The word line conductive layers 41a-41d are formed along the row direction (a direction perpendicular to the paper plane of FIG. 3) as its lengthwise direction, while being arranged along the column direction with a certain pitch. The word line conductive layers 41a-41d uses polysilicon as its material, for example.

As shown in FIG. 3, the memory layer 40 includes a memory gate insulating film 43 and a columnar semiconductor layer 44A. The memory gate insulating film 43 is provided between the columnar semiconductor layer 44A and the word line conductive layer 41a-41d. The columnar semiconductor layer 44A functions as a body (a channel) of the memory transistor MTr1-MTr8.

The memory gate insulating film 43 has a block insulating film 43a, a charge storage layer 43b and a tunnel insulating film 43c, from the side of the word line conductive layer 41a-41d to the side of the memory columnar semiconductor layer 44. The charge storage layer 43b is configured to store electric charges.

The block insulating film 43a is formed on the sidewall of the word line conductive layers 41a-41d with a certain thickness. The charge storage layer 43b is formed on a sidewall of the block insulating film 43a with a certain thickness. The tunnel insulating film 43c is formed on a sidewall of the charge storage layer 43b with a certain thickness. The block insulating film 43a and the tunnel insulating film 43c uses silicon oxide (SiO2) as its material. The charge storage layer 43b uses silicon nitride (SiN) as its material.

The columnar semiconductor layer 44A is formed to penetrate the word line conductive layers 41a-41d and interlayer insulating layers (not shown). The columnar semiconductor layer 44A extends in a direction perpendicular to the substrate 20. A pair of the columnar semiconductor layers 44A is formed to match the vicinity of the end portions of the coupling semiconductor layer 44B in the column direction. For example, the columnar semiconductor layer 44A uses polysilicon (poly-Si) as its material.

In the back gate layer 30 and the memory layer 40, a pair of the columnar semiconductor layers 44A and the coupling semiconductor layer 44B coupling the lower ends of these columnar semiconductor layers 44A configures a memory semiconductor layer 44 functioning as a body (a channel) of the memory string MS. The memory semiconductor layer 44 is formed to have a U shape when seen from the row direction.

Expressing the structure of the back gate layer 30 in other words, the back gate conductive film 31 is formed to surround the side surface and the lower surface of the coupling semiconductor layer 44B via the memory gate insulating film 43.

Also, expressing the structure of the memory layer 40 in other words, the word line conductive layers 41a-41d are formed to surround the side surface of the columnar semiconductor layer 44A via the memory gate insulating film 43.

As shown in FIG. 3, the select transistor layer 50 includes a source-side conductive film 51a and a drain-side conductive film 51b.

The source-side conductive film 51a functions as the source-side selection gate line SGS and a gate of the source-side select transistor SSTr.

The drain-side conductive film 51b functions as the drain-side selection gate line SGD and a gate of the drain-side select transistor SDTr.

The source-side conductive film 51a is formed on the upper side of one of the columnar semiconductor layers 44A which configures the memory semiconductor layer 44. The drain-side conductive film 51b is formed in the same layer as the source-side conductive film 51a, and is formed on the upper side of the other one of the columnar semiconductor layers 44A configuring the memory semiconductor layer 44.

The source-side conductive film 51a and drain-side conductive film 51b are formed to extend along the row direction and arranged in the column direction with a certain pitch. The source-side conductive film 51a and the drain-side conductive film 51b use polysilicon (poly-Si) as its material.

As shown in FIG. 3, the select transistor layer 50 includes a source-side gate insulating film 53a, a source-side columnar semiconductor layer 54a, a drain-side gate insulating film 53b and a drain-side columnar semiconductor layer 54b. The source-side columnar semiconductor layer 54a functions as a body (a channel) of the source-side select transistor SSTr. The drain-side columnar semiconductor layer 54b functions as a body (a channel) of the drain-side select transistor SDTr.

The source-side gate insulating film 53a is provided between the source-side conductive film 51a and the source-side columnar semiconductor layer 54a. The source-side columnar semiconductor layer 54a is formed in a trench 53a formed to penetrate the source-side conductive film 51a. The source-side columnar semiconductor layer 54a is connected to a side surface of the source-side gate insulating film 53a and to an upper surface of one of the pair of the columnar semiconductor layer 44A. The source-side columnar semiconductor layer 54a is formed in a columnar shape that extends in a perpendicular direction to the substrate. The source-side columnar semiconductor layer 54a uses polysilicon (poly-Si) as its material.

The drain-side gate insulating film 53b is provided between the drain-side conductive film 51b and the drain-side columnar semiconductor layer 54b. The drain-side columnar semiconductor layer 54b is formed in a trench 53b formed to penetrate the drain-side conductive film 51b. The drain-side columnar semiconductor layer 54b is connected to a side surface of the drain-side gate insulating film 53b and to an upper surface of the other one of a pair of the columnar semiconductor layer 44A, and extends in a direction perpendicular to the substrate 20. For example, the drain-side columnar semiconductor layer 54b uses polysilicon (poly-Si) as its material.

As shown in FIG. 2 and FIG. 3, the wiring layer 60 includes a source line layer 61, a bit line layer 62, and a plug layer 63. The source line layer 61 functions as a source line SL. The bit line layer 62 functions as a bit line BL.

The source line layer 61 is formed to be in touch with the upper surface of the source-side columnar semiconductor layer 54a and extend in the row direction. The bit line layer 62 is formed to be in touch with the upper surface of the drain-side columnar semiconductor layer 54b via the plug layer and extend in the column direction. The source line layer 61, the bit line layer 62 and the plug layer 63 use tungsten as their material, for example.

Next, with reference to FIG. 4, a shape of the word line conductive layer 41a will be described in detail. Note that since the word line conductive layers 41b-41d each has a shape like the word line conductive layer 41a, explanation thereof is omitted.

Figure 4:
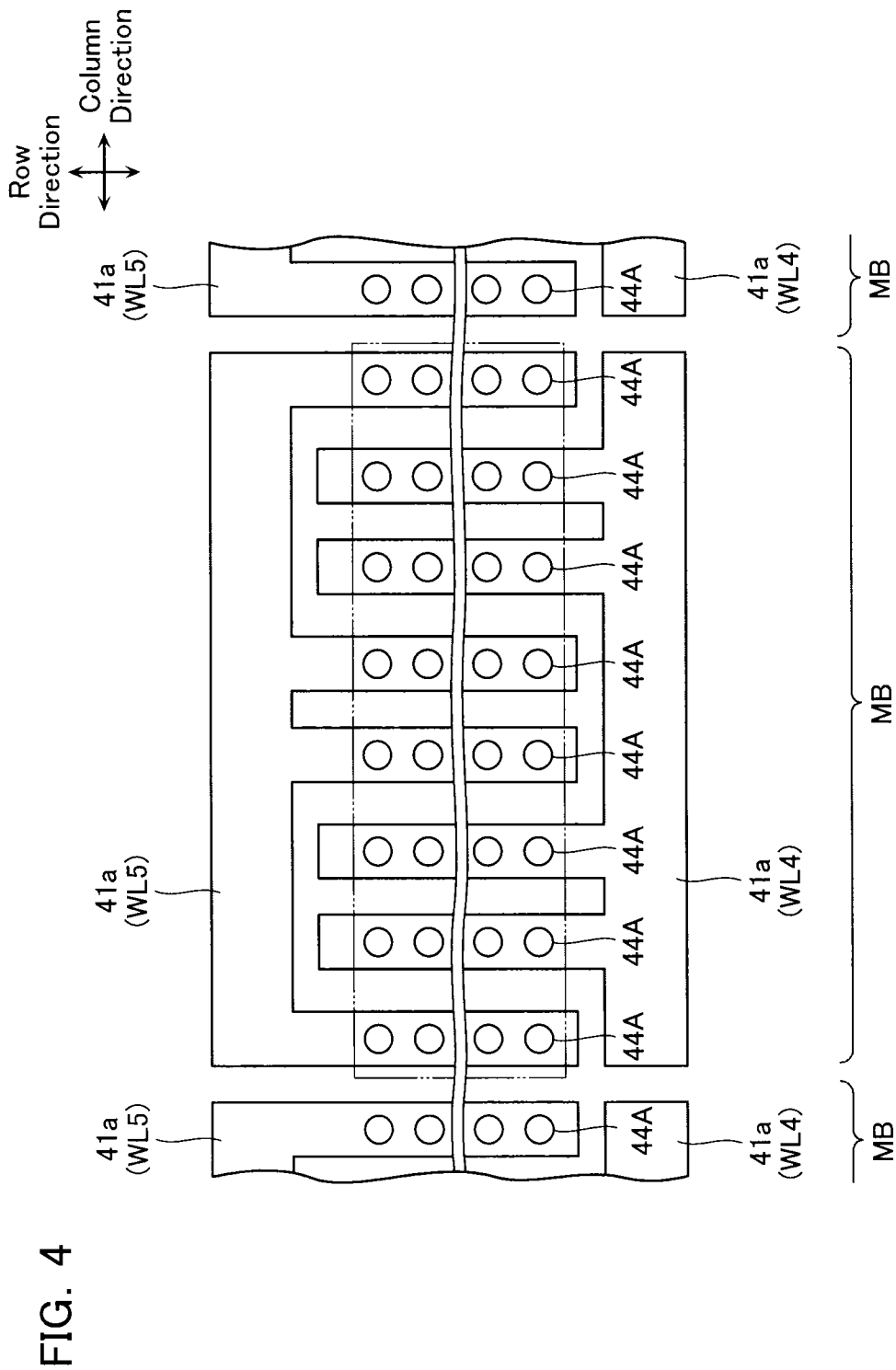
Figure 5:
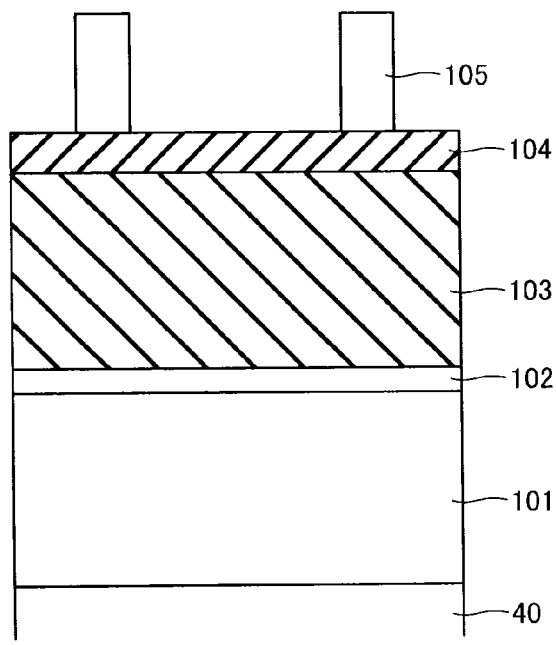
FIG. 5 is a process chart illustrating a method of forming memory holes of the first embodiment.

As shown in FIG. 4, a pair of the word line conductive layers 41a are provided for one memory block MB. The pair of the word line conductive layers 41a are arranged to have comb teeth shapes and to engage to each other from left and right, when seen from the top surface thereof.

The above-mentioned columnar semiconductor layers 44a are formed to penetrate the word line conductive layers 41a-41d. Note that the columnar semiconductor layers 44a have first columnar semiconductor layers and second columnar semiconductor layers, since they are formed by the process steps described later. The first columnar semiconductor layers are arranged in a zigzag manner, while the second columnar semiconductor layers are arranged between the first columnar semiconductor layers, and are similarly arranged in a zigzag manner. The first columnar semiconductor layers and the second columnar semiconductor layers have the substantially same diameter, but they are a little bit different in shape from each other.

Also, the number of the first columnar semiconductor layers arranged along a horizontal direction perpendicular to the stacking direction is larger than the number of the second columnar semiconductor layers sandwiched therebetween. Here, "different in shape" herein means that they have the tendency of having a constant shape, and does not mean that all of the first columnar semiconductor layers have an identical shape. It does not mean that all of the second columnar semiconductor layers have an identical shape, either. Note that since a method of manufacturing a nonvolatile semiconductor memory device illustrated in FIG. 1 to FIG. 4 is known by patent applications that were already filed by this applicant, the detailed description thereof is omitted here.

The nonvolatile semiconductor memory device with a three dimensional structure described above includes many columnar semiconductor layers 44A. These columnar semiconductor layers 44A are formed by burying a lot of memory holes. The memory holes are formed to penetrate the laminated word line conductive layers 41 and interlayer insulating layers formed therebetween (not shown).

By the way, such memory holes are formed by photolithography and etching, as is similar to wiring lines. The dimension of the memory holes depends on the resolution limit of the photolithography. In addition, as a technique for forming memory holes with a dimension less than the resolution limit of the photolithography, a so-called sidewall transfer process is known. This sidewall transfer process is a technique where a sidewall film is formed on the sidewall of a mask material, and thereafter, by removing this mask material, etching is conducted using the remained sidewall film as a mask. The memory hole may be formed to have a dimension under resolution limit of the photolithography, using this sidewall transfer process.

However, there is a problem that with a conventional method, variations in dimension and shape inevitably arise. According to a manufacturing method according to this embodiment, the variation in dimension and shape may be suppressed.

With reference to FIG. 5-FIG. 16, a method of forming memory holes according to this embodiment will be described.

After the above-mentioned memory layer 40 (a film to be processed) is formed, for example, on the surface of the memory layer 40, a first hard mask 101, a second hard mask 102, a third hard mask 103, a fourth hard mask 104, and a fifth hard mask 105 are stacked in this order. The first mask 101 includes a BSG film (Boron-doped silicate glass) or the like. The second mask 102 includes amorphous silicon or the like. The third hard mask 103 includes silicon nitride (SiN), for example. The fourth hard mask 104 includes a TEOS film, for example. The fifth hard mask 105 include amorphous silicon, for example. Here, it is needless to say that the materials that have been given above as materials of the hard masks 101 to 105 are merely examples, and other materials may be selected as long as they have characteristics that provide the later-described processes. The first hard mask 101 and the second hard mask 102 are hard masks for processing the memory layer 40. In addition, the third hard mask 103, the fourth hard mask 105 and the fifth hard mask 105 are hard masks for controlling a hole diameter of the memory holes. As a whole, the first to fourth hard masks 101-104 function as mask materials for processing the memory 40 which is a film to be processed. Also, the fifth hard mask 105 acts as a sacrifice film to be described below.

Figure 6:
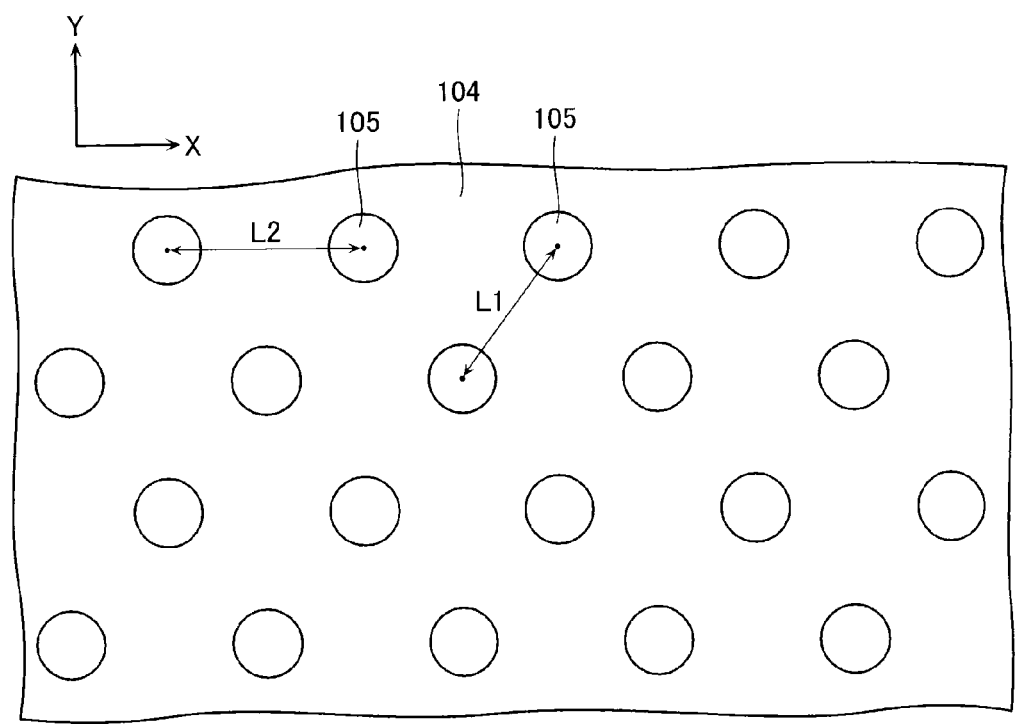
FIG. 6 is a process chart illustrating a method of forming memory holes of the first embodiment.

And, by photolithography and RIE (Reactive Ion Etching), the fifth hard mask 105 is shaped into many columnar masks as shown in FIG. 6 (hereinafter, such columnar masks are called columnar masks 105). The columnar masks 105 are arranged in a zigzag manner, as shown in FIG. 6. That is, a plurality of the columnar masks 105 arranged along a first column in X-axis direction in FIG. 6 are arranged with an interval L2. Similarly, a plurality of the columnar masks 105 in a second column are arranged with an interval L2. However, one of the columnar masks 105 in the second column is formed at a position between the columnar masks 105 in the first column. The distance L1 between the columnar mask 105 on the first column and the columnar mask 105 on the second column is set to be smaller than the distance L2 (L1<L2). Note that, in addition to photolithography and RIE, a diameter of the columnar masks 105 may be made smaller by performing a slimming process using a wet etching.

Figure 7:
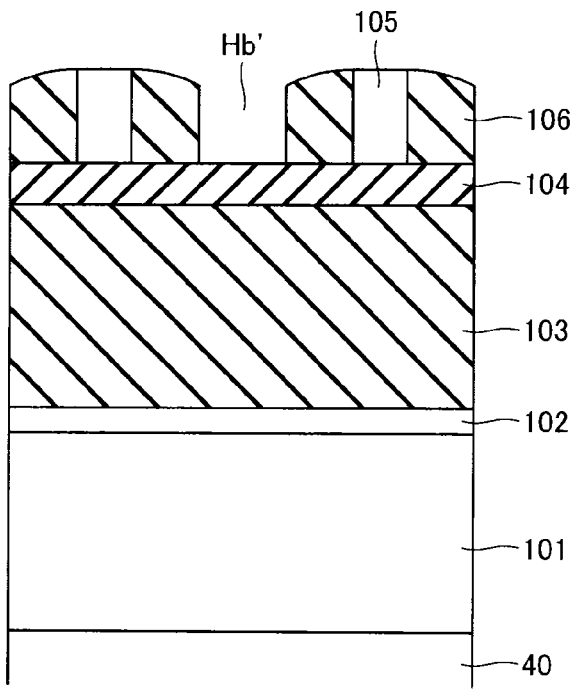
FIG. 7 is a process chart illustrating a method of forming memory holes of the first embodiment.
Figure 8:
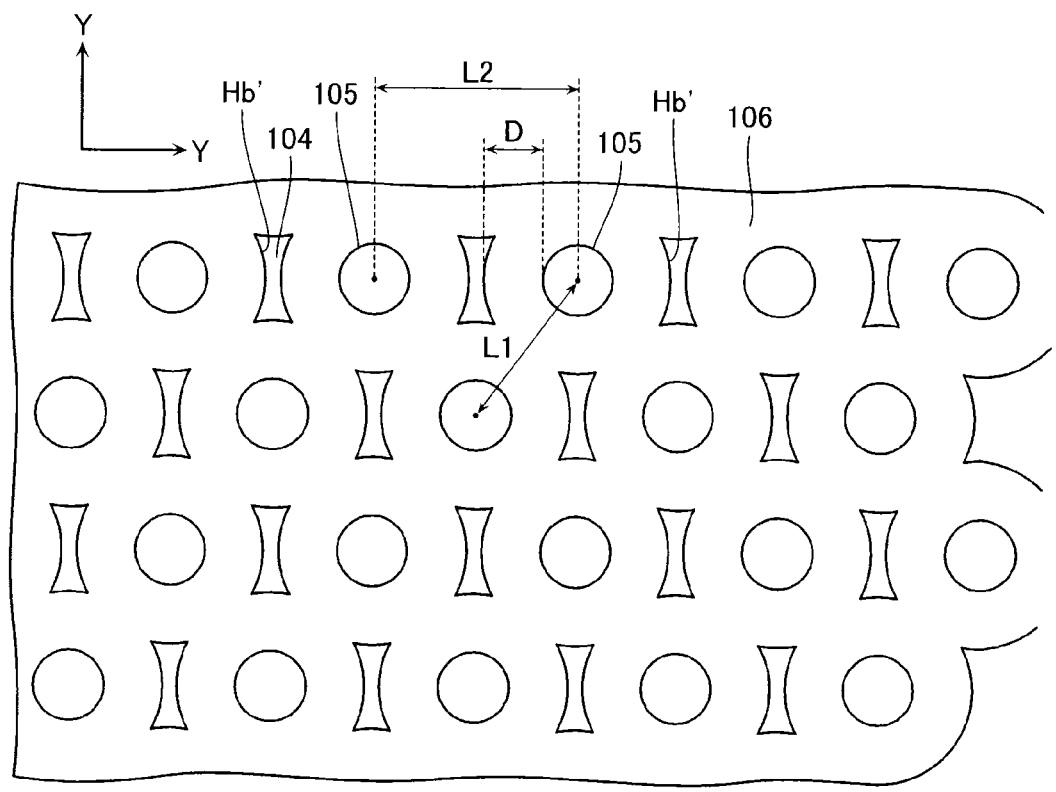
FIG. 8 is a process chart illustrating a method of forming memory holes of the first embodiment.

A reflow sidewall film such as a BPSG (Boron-Phosphorous doped silicate glass) is deposited by a low pressure CVD method, for example, against the columnar fifth hard masks 105. As shown in FIG. 7 and FIG. 8, a sidewall film 106 is formed on a sidewall of the fifth hard mask 105.

The film thickness D of the sidewall film 106 is set to be slightly larger than a difference between half of the distance L1 and a radius R5 of the fifth hard mask 105 (D<L1/2−R5), and is smaller than a difference between half of the distance L2 and R5 (D<L2/2−D5). Due to this, the sidewall film 106 along the fifth hard masks 105 in the first column thereby contact the sidewall film 106 along the fifth hard masks 105 in the second column, in a diagonal direction.

Figure 9:
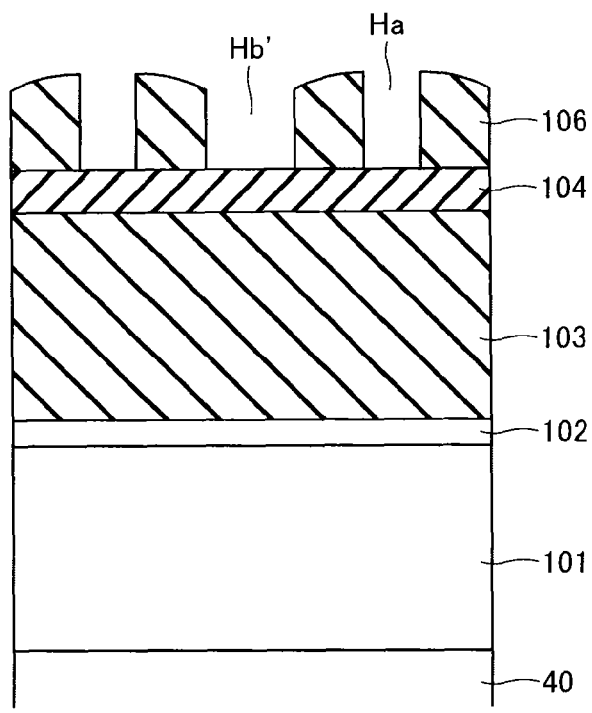
FIG. 9 is a process chart illustrating a method of forming memory holes of the first embodiment.

On the other hand, the sidewall films 106 along two fifth hard masks 105 arranged along the same column (X-axis direction) do not contact each other, and form a hole Hb' therebetween. This hole Hb' has a rectangle-like shape with its central part narrowed, as shown in FIG. 8, since the fifth hard masks 105 are arranged in a zigzag manner. Thereafter, the columnar masks 105 (sacrifice film) are removed using alkaline solution. As shown in FIG. 9, after the columnar masks 105 are removed, holes Ha are formed.

Figure 10:
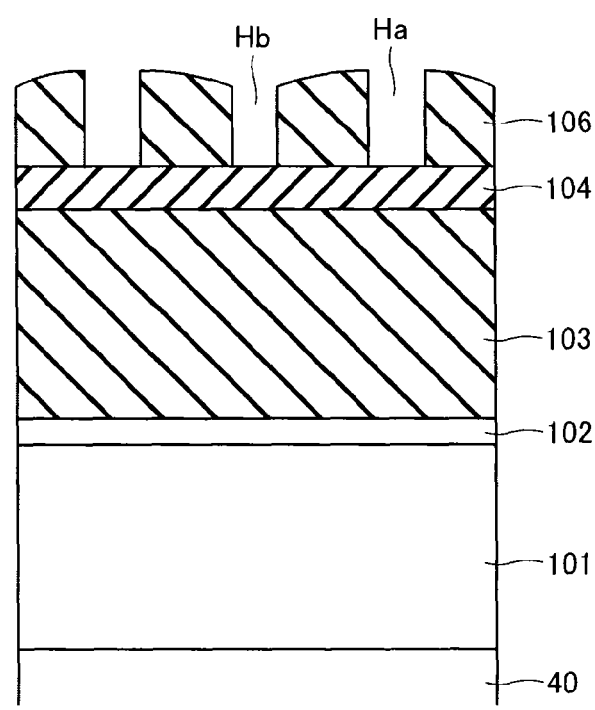
FIG. 10 is a process chart illustrating a method of forming memory holes of the first embodiment.
Figure 11:
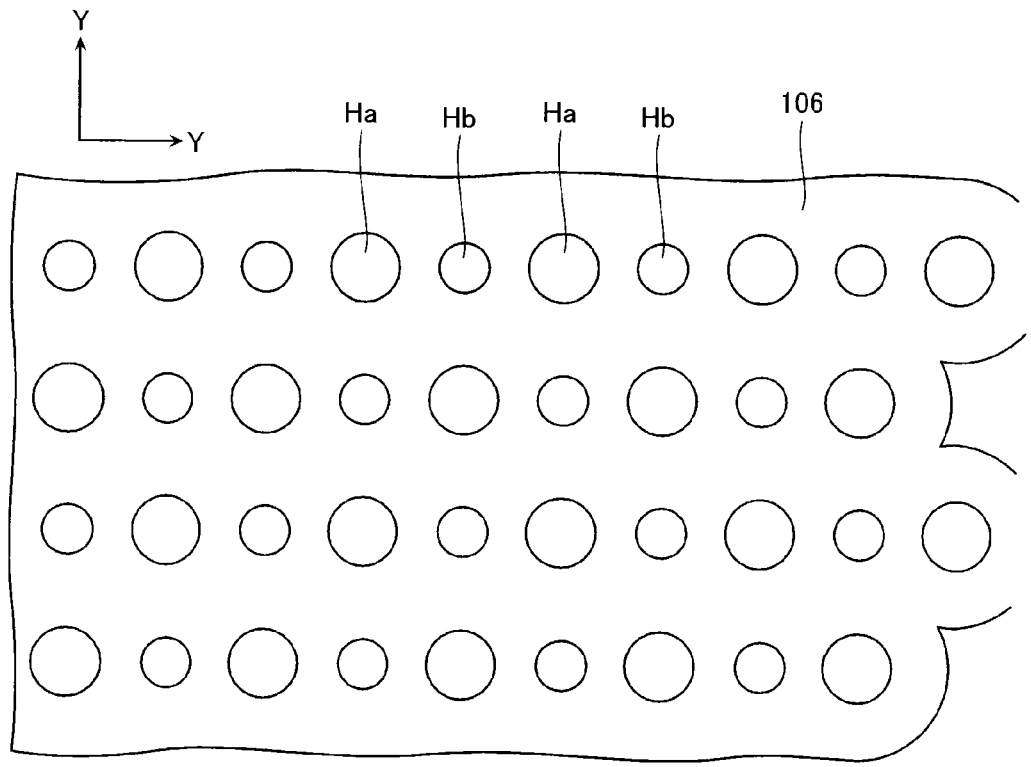
FIG. 11 is a process chart illustrating a method of forming memory holes of the first embodiment.

Then, for example, a heat process in an oxygen atmosphere, with a temperature of 800 degrees Celsius and 10 minutes are given. This causes a BPSG film (sidewall film 106) having a low melting point to flow, and surface energy thereof is relaxed. Thereby, the holes Hb' with a rectangle-like shape are transformed into holes Hb with a high roundness, as shown in FIG. 10 and FIG. 11. However, a size and shape of the holes Hb becomes different from those of the holes Ha. Also, the hole Hb is formed in a position sandwiched between two holes Ha. Accordingly, the number of the holes Ha in the X direction and Y direction is larger than the number of holes Hb.

Figure 12:
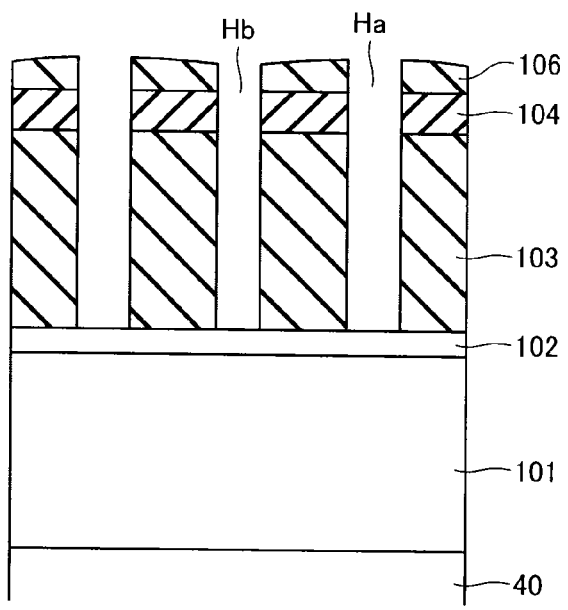
FIG. 12 is a process chart illustrating a method of forming memory holes of the first embodiment.

Next, RIE is performed on the fourth hard mask 104 and the third hard mask 103 using the sidewall film 106 (BPSG film) having the holes Ha and Hb as a mask. Thereby, as shown in FIG. 12, the holes Ha and Hb reaches the top surface of the second hard mask 102, respectively.

Figure 13:
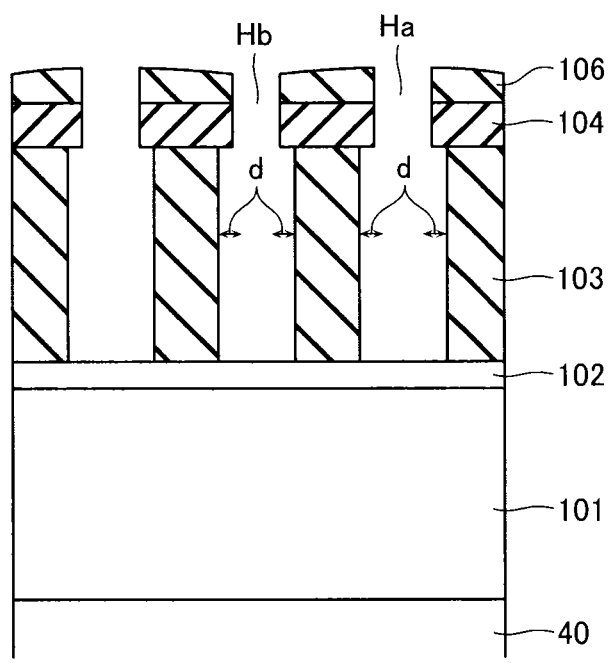
FIG. 13 is a process chart illustrating a method of forming memory holes of the first embodiment.
Figure 14:
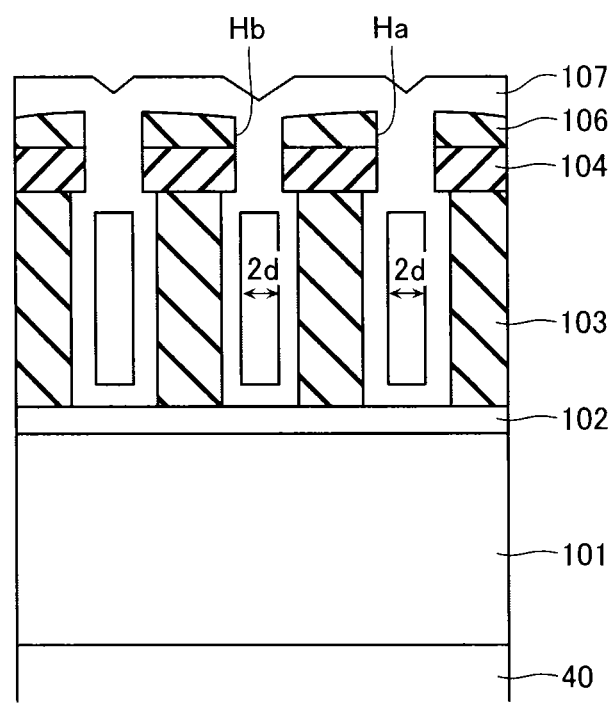
FIG. 14 is a process chart illustrating a method of forming memory holes of the first embodiment.

Subsequently, as shown in FIG. 13, a wet etching (isotropic etching) using the heat phosphoric acid solution is performed to etch the third hard mask 103. In this wet etching, only the third hard mask 103 is etched by a difference in etching rate, while the fourth hard mask 104 and the sidewall film 106 are hardly etched. The position of the side surface of the third hard mask 103 is etched back by a distance d, for example, in comparison with the position of the side surface of the fourth hard mask 104 and the sidewall film 106. This distance d determines a diameter of the memory holes that are to be finally formed.

Subsequently, an deposition layer 107 comprising silicon nitride, for example, is deposited in the holes Ha and Hb, and on the surface of the sidewall film 106, using a low pressure CVD method. In the holes Ha and Hb, the fourth hard mask 104 and the sidewall film 106 protrude by the distance d, from the third hard mask 10. Accordingly, the deposition layer 107 first fills the part of the fourth hard mask 104 and the sidewall film 106 (an opening of the hole Ha and Hb), and a cavity is remained at the part of the third hard mask 103. The diameter of the cavity becomes 2d, regardless of the diameter of the original hole Ha and Hb.

Figure 15:
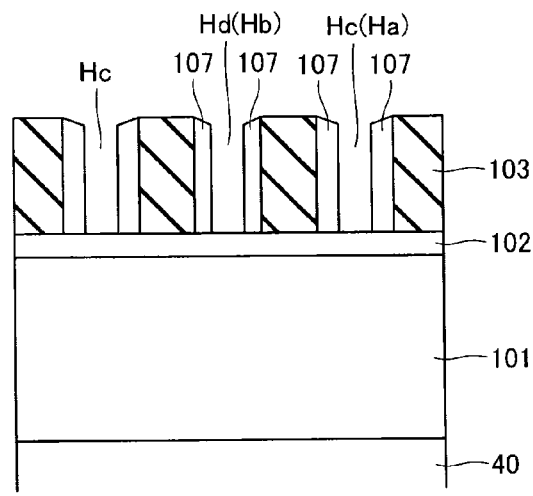
FIG. 15 is a process chart illustrating a method of forming memory holes of the first embodiment.
Figure 16:
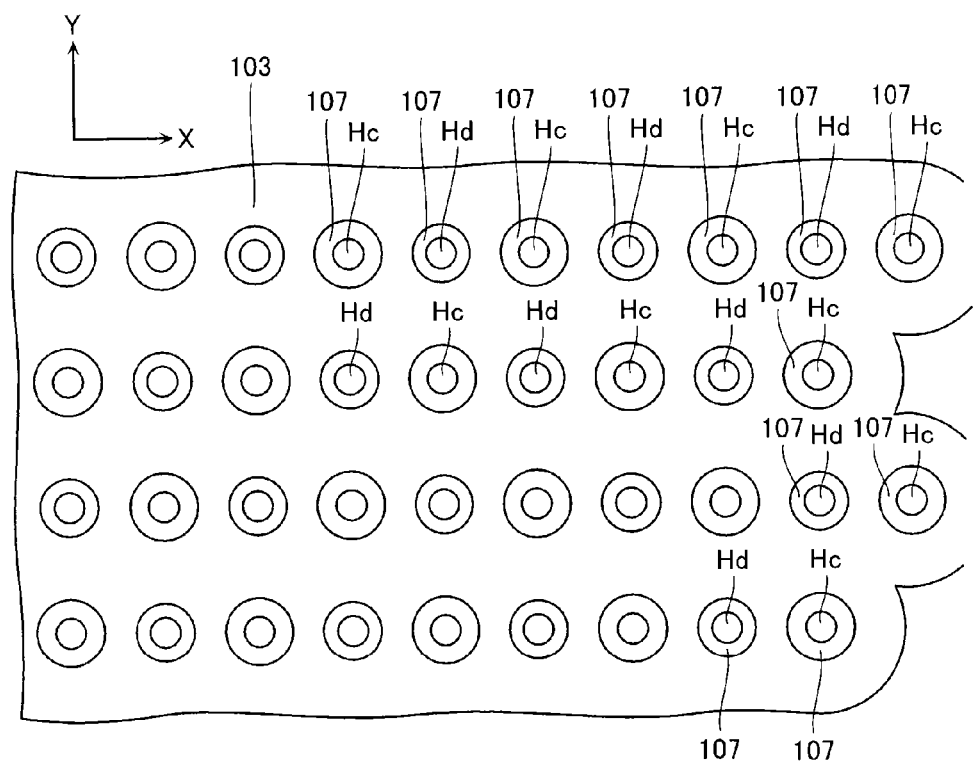
FIG. 16 is a process chart illustrating a method of forming memory holes of the first embodiment.

Then, for example, a wet etching is performed in the condition that a silicon nitride film and a TEOS film are etched at one-to-one ratio, thereby the deposition layer 107, the sidewall film 106 and the fourth hard mask 104 near the opening of the holes Ha and Hb are removed. Due to this, as shown in FIG. 15 and FIG. 16, holes Hc are formed where the holes Ha were formed, while holes Hd are formed where the holes Hb were formed. Even if the diameter of the hole Ha and the diameter of the hole Hb have a significant difference, the diameters of the holes Ha and Hd becomes 2d. The distance 2d herein is determined by the amount of wet etching d which has been explained in FIG. 13. RIE is performed on the first hard mask and the second hard mask using the third hard mask 103 having such the holes Hc and Hd and the deposition layer 107 as masks. Furthermore, RIE is performed on the memory layer 40 that are under these first and second hard masks. This allows the memory holes to be formed with uniform diameters and with diameters under the resolution limit of photolithography.

The holes Hc are derived from the columnar masks 105 which have columnar shapes, while the holes Hd are derived from the holes Hd which have rectangle-like shapes. Accordingly, the feature in shape of the both holes are slightly different. However, both the holes Ha and Hb becomes circle-like shape by the heat process explained in FIG. 11. Thus, no meaningful difference with respect to the characteristics of the memory strings will be created.

As illustrated in FIG. 16, the holes Hc are arranged along the X axis direction. The holes Hd are arranged along the X axis direction so as to be sandwiched between the holes Hc. In addition, in an edge in the X axis direction of the memory cell array 1, the holes Hc and Hd are arranged along the Y axis direction, respectively.

As explained above, according to the above-mentioned embodiment, it is possible to provide a non-volatile semiconductor memory device that has memory holes with diameters less than the resolution limit of photolithography, and with uniform diameters and shapes. Specifically, the diameter 2d of the holes Hc and Hd formed in this embodiment becomes smaller by about 60-70% than the diameters of the columnar masks 105 which are created first and has columnar shapes. This allows memory holes with a minute pitch to be formed without using advanced techniques such as the EUV lithography. In addition, the cost in the manufacturing process may be suppressed. A meaningful variation does not occur in diameter and shape of the memory holes.

Note that in the example of FIG. 6, an example has been explained where the columnar masks 105 along an even-numbered line are each in an intermediate position between the columnar masks 105 along an odd-numbered line. In other words, in the example of FIG. 6, the columnar masks 105 are arranged to form an isosceles triangle. In this case, the holes Hc and Hd which will be finally formed are arranged substantially in a rectangular grid shape along X direction and Y direction.

Figure 17:
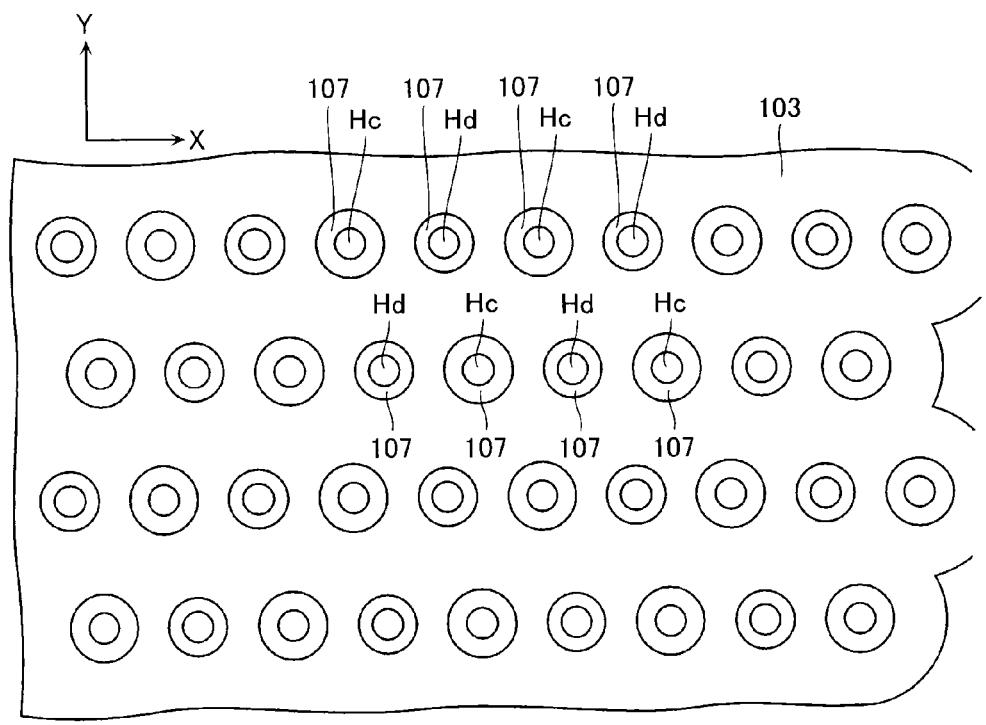
FIG. 17 illustrates a modified example of the first embodiment.

However, it is not necessary that the columnar masks 105 along an even-numbered line are each in an intermediate position between the columnar masks 105 along an odd-numbered line. In other words, the three columnar masks 105 that are arranged in two lines may form a scalene triangle. In this case, as shown in FIG. 17, the holes Hc and Hd which will be finally formed are arranged not in a straight line along the Y direction, but in a zigzag manner, which is different from FIG. 16.

Second Embodiment

Figure 18:
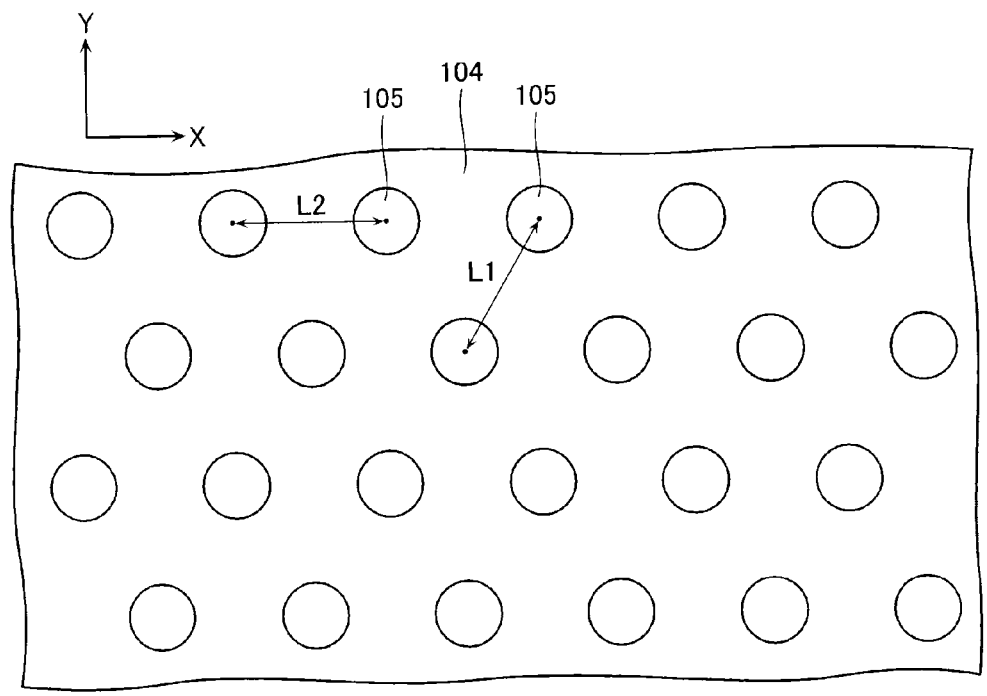
FIG. 18 is a process chart illustrating a method of forming memory holes of the second embodiment.

Next, with reference to FIG. 18-FIG. 21, a non-volatile semiconductor memory device according to the second embodiment will be described. The entire structure of the nonvolatile semiconductor memory device according to the second embodiment is substantially the same as that of the first embodiment (FIG. 1 to FIG. 4). In addition, the manufacturing process of the second embodiment is also substantially the same as that of the first embodiment (FIG. 5 to FIG. 16). This second embodiment is different from the first embodiment in that the columnar masks 105 are arranged such that the distance L1 and the distance L2 are substantially equal, as shown in FIG. 18.

Figure 19:
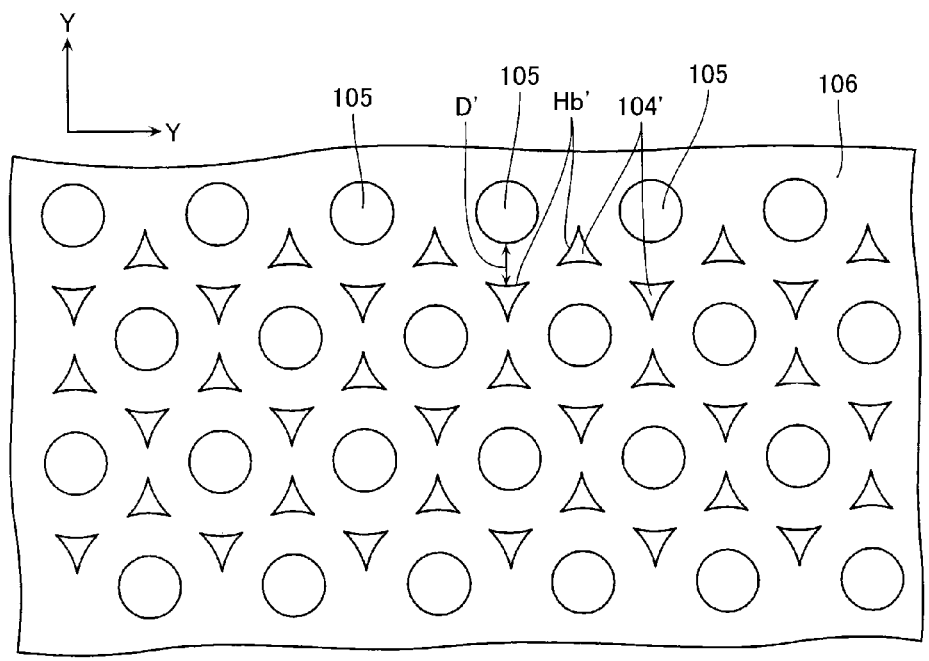
FIG. 19 is a process chart illustrating a method of forming memory holes of the second embodiment.
Figure 20:
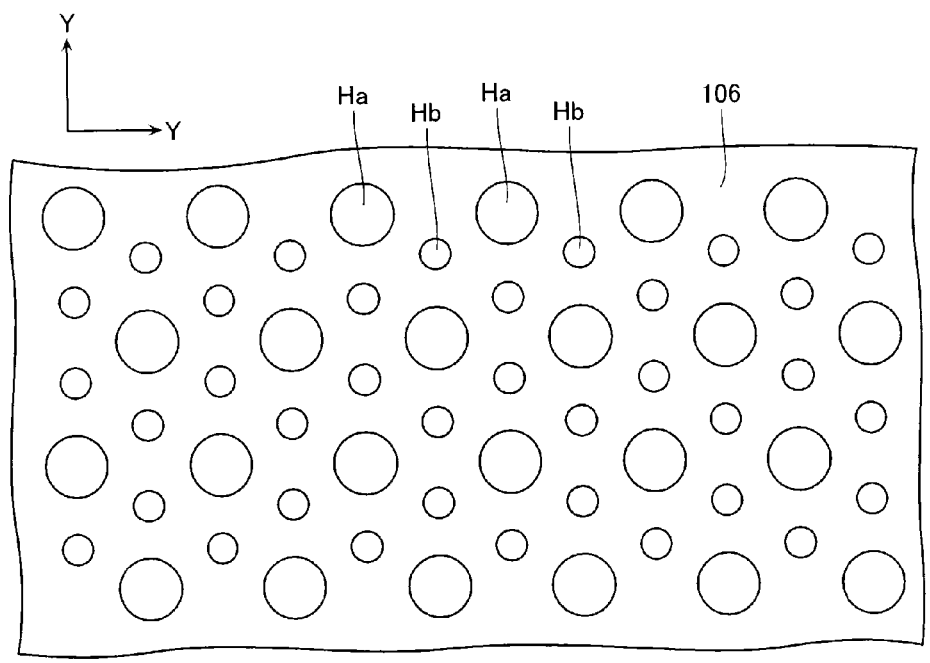
FIG. 20 is a process chart illustrating a method of forming memory holes of the second embodiment.
Figure 21:
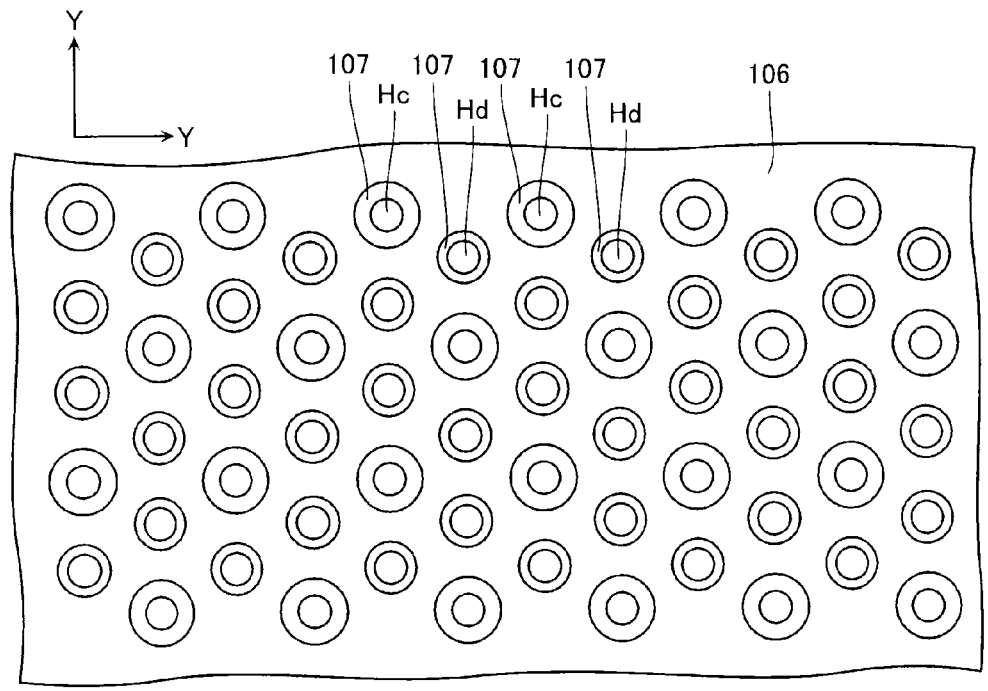
FIG. 21 is a process chart illustrating a method of forming memory holes of the second embodiment.

In addition, a sidewall film 106 with a film thickness D' is formed on the sidewalls of the columnar masks 105 arranged in this way, in a similar manner to that of the first embodiment. The film thickness D' is set to such a thickness that forms a triangle-like hole Hb" near the center of a triangle formed by connecting three columnar masks 105, as shown in FIG. 19. Then, a heat process in an oxygen atmosphere, with a temperature of 800 degrees Celsius and 10 minutes are given to cause the sidewall films 106 to flow. This causes the triangle-like hole Hb" to be transformed into a hole Hb with a high roundness. Thereafter, as shown in FIG. 21, the deposition layer 107 formed of silicon nitride is deposited inside the holes Ha and Hb and on the surface of the sidewall film 106, using a low pressure CVD method, which is similar to the first embodiment (FIG. 15 and FIG. 16). With the second embodiment, it is possible to provide a non-volatile semiconductor memory device that has memory holes with diameters less than the resolution limit of photolithography, and with uniform diameters and shapes.

Third Embodiment

Figure 22:
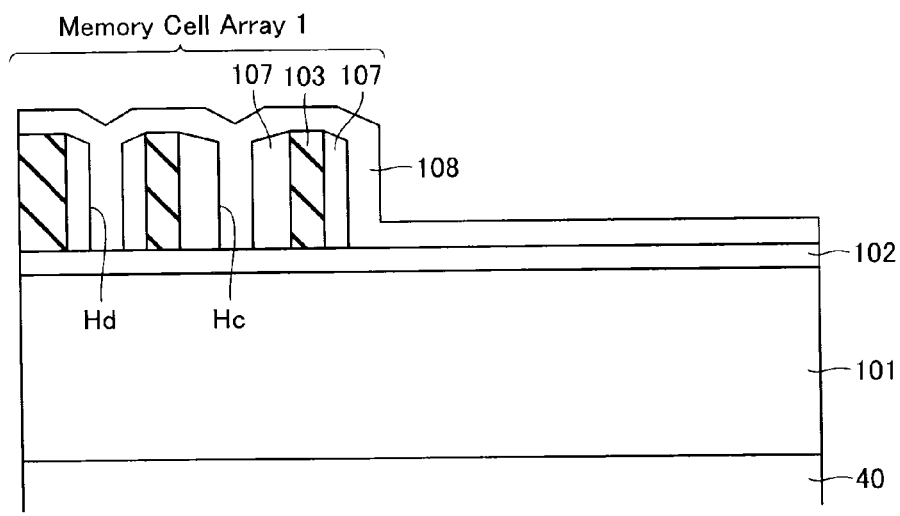
FIG. 22 is a process chart illustrating a method of forming memory holes of the third embodiment.

Next, with reference to FIG. 22-FIG. 25, a non-volatile semiconductor memory device according to the third embodiment will be described. The entire structure of the nonvolatile semiconductor memory device according to the third embodiment is substantially the same as that of the first embodiment (FIG. 1 to FIG. 4). In addition, the manufacturing process of the second embodiment is also substantially the same as that of the first embodiment (FIG. 5 to FIG. 16). This second embodiment has a feature in that it has an additional manufacturing process in addition to a manufacturing process of the first embodiment. As shown in FIG. 22, in this third embodiment, after the process of FIG. 15 of the first embodiment, a sacrifice film 108 including a TEOS film or the like is deposited by chemical vapor deposition, thereby burying the holes Hc and Hd by the sacrifice film 108. Furthermore, the sacrifice film 108 other than the inside of the holes Hc and Hd is removed by performing RIE or wet etching.

Figure 23:
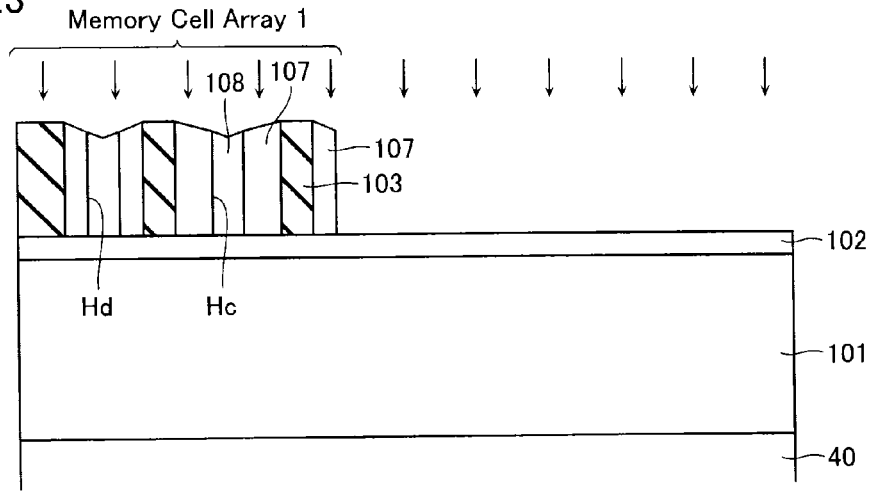
FIG. 23 is a process chart illustrating a method of forming memory holes of the third embodiment.

Then, as shown in FIG. 23, ion implantation of boron (B) is conducted under a condition of 5 keV, 1e15 cm-2, for example, in the direction of the second hard mask 102. In this case, Boron is injected to the second hard mask 102 in a region where the third hard mask 103 and the deposition layer 107 are not formed (that is, a region outside the memory cell array). On the other hand, the boron (B) is hardly injected to the second hard mask 102 in a region where the third hard mask 103 and the deposition layer 107 are formed.

Figure 24:
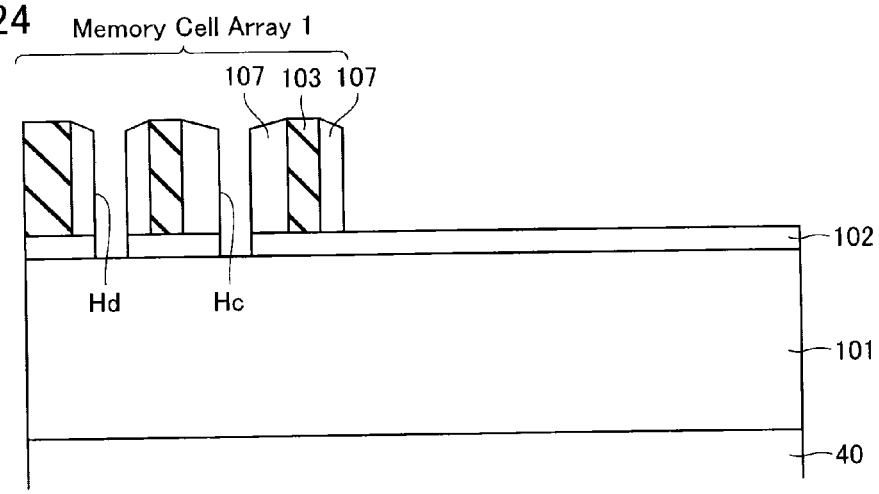
FIG. 24 is a process chart illustrating a method of forming memory holes of the third embodiment.

As shown in FIG. 24, after having removed the sacrifice film 108 by a buffered hydrofluoric acid process, the second hard mask 102 is etched by performing an alkali process. In this case, the second hard mask 102 in the bottom of the holes Hc and Hd are etched, because boron is not injected by the process of FIG. 23. In contrast, in the second hard mask 102 in other area, the etching rate is greatly reduced because boron has been injected thereto. Therefore, the second hard mask 102 in such region remains without being etched.

Figure 25:
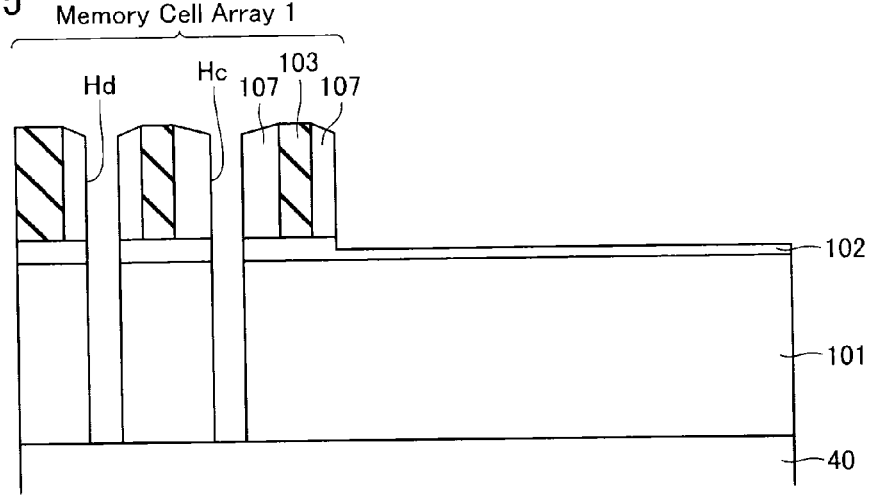
FIG. 25 is a process chart illustrating a method of forming memory holes of the third embodiment.

From the state of FIG. 24, as shown in FIG. 25, RIE is performed on the first hard mask 101 using, as masks, the third hard mask 103, the deposition layer 107 and the second hard mask 102 that has been left.

According to this third embodiment, it is possible to leave the second hard mask 102 outside the memory cell array 1 without an additional lithography process. Accordingly, the first hard mask 101 outside the memory cell array 1 remains without being etched, and the memory layer 40 under the first hard mask 101 also remains without being etched. The memory layer 40 outside the memory cell array 1 is processed to a step-like shape, and is used as a contact formation region for connecting contact plugs. Thus, according to the present embodiment, such contact formation region or the like can be formed at a low cost.

Note that it is possible to omit a process of forming a sacrifice film 108 shown in FIG. 22, and instead of this, perform ion implantation in FIG. 23 using an oblique ion implantation (an injection angle is 30 degrees or more). This allows the same advantage to be obtained.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

For example, a case has been explained as an example where the memory holes of the non-volatile semiconductor memory device shown in FIG. 1 to FIG. 4 are formed, but the present invention is not limited to this. For example, the present invention may be applied to a non-volatile semiconductor memory device according to the variation shown in FIGS. 26 to 28.

Figure 26:
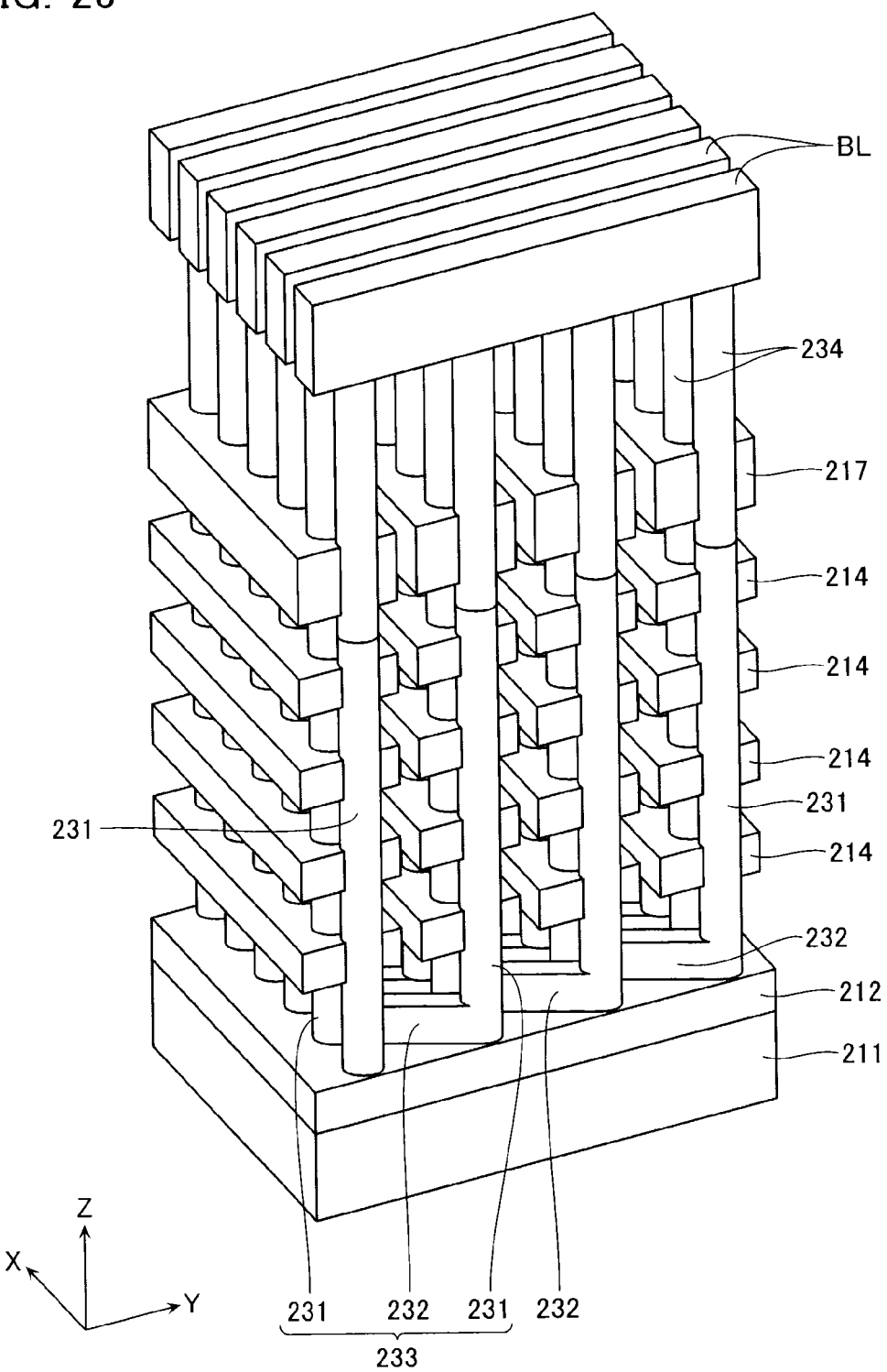
FIG. 26 is a perspective view illustrating a stacking structure of a memory block MB of the non-volatile semiconductor memory device according to the modification.
Figure 27:
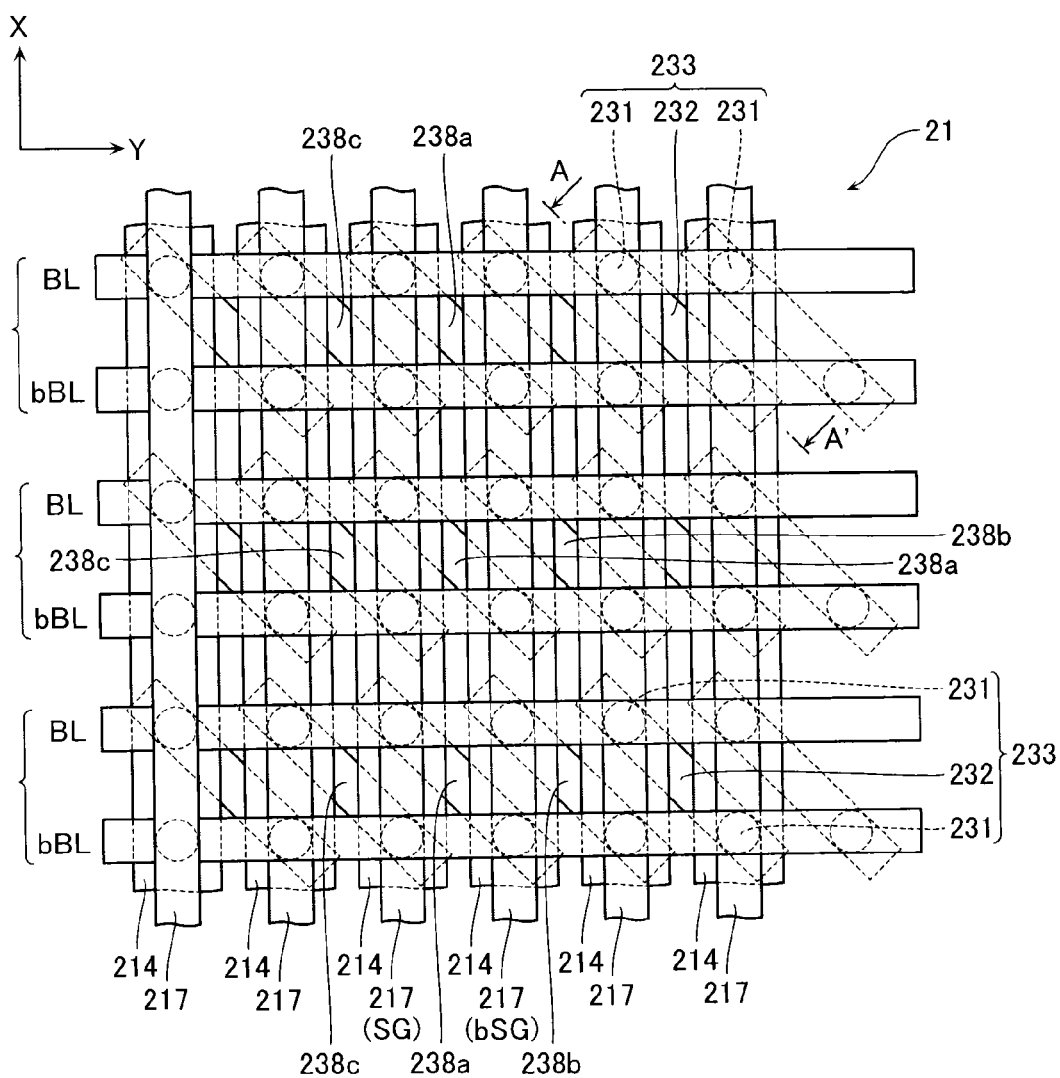
FIG. 27 is plan view illustrating a structure of a memory block MB of the non-volatile semiconductor memory device according to the modification.
Figure 28:
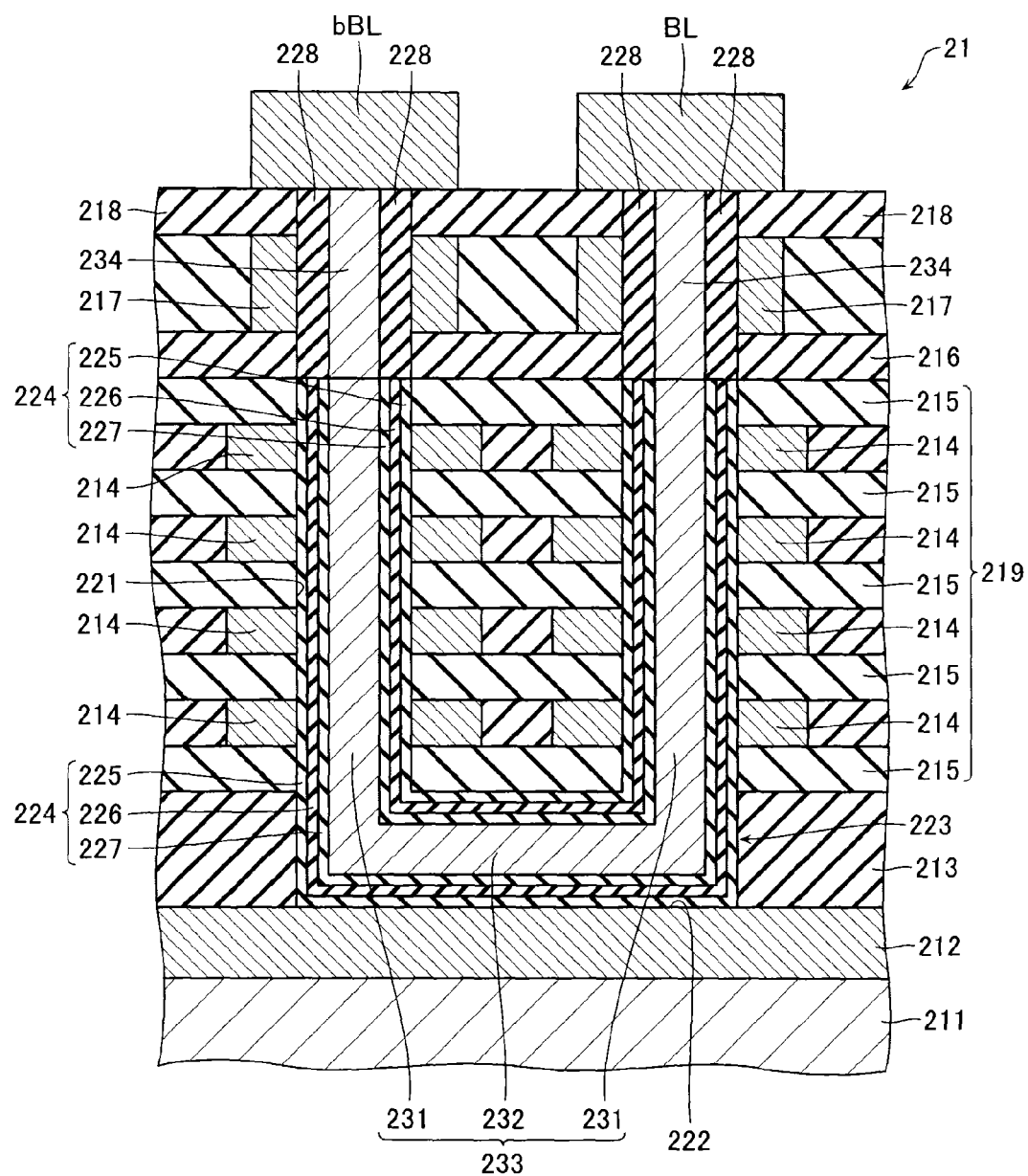
FIG. 28 is a schematic cross-sectional view illustrating a stacking structure of a memory block MB of the non-volatile semiconductor memory device according to the modification.

When the present invention is applied to the non-volatile semiconductor memory device of the variation shown in FIG. 26 to FIG. 28, the number of wiring layers may be reduced. In addition, this may enjoy a merit that it is unnecessary to open unnecessary memory holes in an end portion of the memory cell array.

Hereinafter, the non-volatile semiconductor memory device according to this variation will be explained with reference to FIGS. 26 to 28.

FIG. 26 is a perspective view that exemplifies a non-volatile semiconductor memory device according to the present embodiment. FIG. 27 is a plan view exemplifying the non-volatile semiconductor memory device according to the present embodiment. FIG. 28 is an A-A' cross sectional view of FIG. 27.

As shown in FIG. 26, in the non-volatile semiconductor memory device according to this variation, an impurity diffusion layer is formed on an upper layer of the silicon substrate 211, and this layer forms a back gate 212.

As shown in FIG. 26, an insulating film 213 is provided on the silicon substrate 211, and on the insulating film 213, a plurality of electrode films 214 and insulating films 215 are laminated alternately, respectively. As explained below, the electrode films 214 are formed of polysilicon, and function as control gates (CG) of the memory cells.

On the other hand, the insulating films 215 are formed of silicon oxide (SiO2), and function as the interlayer insulation layer that insulate the electrode films 214 from one another. The plurality of electrode films 214 and insulating films 215 configure a stacked body 219.

In the stacked body 219, an insulating film 216, a select gate electrode 217 and an insulating film 218 are stacked on this order.

For example, the select gate electrode 217 is formed by dividing a conductive film formed of polysilicon or the like along a Y-direction. The select gate electrode 217 is a plurality pieces of wire-shaped conductive material extending along the X-direction.

Also, the electrode film 214 is formed by dividing a conductive film formed of polysilicon or the like along a Y-direction. The electrode film 214 is a plurality pieces of wire-shaped conductive material extending along the X-direction. The electrode film 214 is divided for the select gate electrode 217, and, immediately under one select gate electrode 217, the electrode films 14 each for each of the steps are arranged in plural layers. That is, the electrode films 214 are arranged in a shape of a matrix in Y Z plane, and are isolated from one another.

Furthermore, as shown in FIG. 26 to FIG. 28, in the stacked body 219, the insulating film 216, the select gate electrode 217 and the insulating film 218, a plurality of penetration holes 221 are formed extending in the stacking direction (Z-direction). The penetration holes 221 are arranged in the shape of a matrix along the X-direction and the Y-direction. The arrangement pitch is constant in both the X-direction and the Y-direction.

In one select gate electrode 217, a plurality of penetration holes 221 penetrate therethrough, and arranged in one line along the X-direction. Thus, the penetration holes 221 arranged along the X-direction penetrate the same select gate electrode 217 and the same electrode films 214, but penetration holes 221 arranged along the Y-direction penetrate different select gate electrodes 217 and different electrode films 214. Also, each of the penetration holes 221 penetrates the whole stacked body 219, but does not penetrate the back gate 21.

Also, in the insulating film 213, interconnecting holes 222 are formed. Each of the interconnecting holes 222 is formed to connect a lower end of a certain penetration hole 221 to a lower end of another penetration hole 221 located at a position distant from the certain penetration hole 221 by one column in the X-direction and by one line in the Y-direction, seeing from the certain penetration hole 221 (hereinafter this position is referred to as "an oblique position"). Due to this, a pair of the penetration holes 221 arranged at oblique positions from each other, and the interconnecting hole 222 mutually connecting these penetration holes 221 form a U-shaped hole 223 that is continuous as a one hole. Each of the penetration holes 221 is always connected to another penetration hole 221 via the interconnecting hole 222.

In addition, in the U-shaped hole 223, an ONO film (Oxide Nitride Oxide film) is provided on the internal surface of the U-shaped hole 223 positioned at an internal part of the stacked body 219. In the ONO film 224, a block insulating film 225 with an insulation characteristic, a charge deposition layer 226, and a tunnel layer 227 with a insulation characteristic are laminated sequentially from the outside. The block insulating film 225 contacts with the insulating film 213, the electrode film 214 and the insulating film 215. The block insulating film 25 and the tunnel layer 227 are formed of silicon oxide (SiO2), and the charge deposition layer 226 is formed of silicon nitride (SiN). On the other hand, in the U-shaped hole 223, a gate insulating film 228 is provided on the internal surface of the U-shaped hole 223 positioned at the internal part of the insulating film 216, the select gate electrode 217 and the insulating film 218.

A semiconductor such as polysilicon to which impurities are doped is embedded in the inside of the U-shaped hole 223. Due to this, in a part of the internal part of the penetration hole 221 corresponding to the stacked body 219, a silicon pillar 231 formed of polysilicon or the like is formed. Also, in a part of the internal part of the penetration hole 221 corresponding to the insulation film 216, the select gate electrode 217 and the insulation film 218, a silicon pillar 231 formed of polysilicon or the like is formed.

The upper end of the silicon pillar 231 is connected to the lower end of the silicon pillar 234. The shape of the silicon pillar 231 and 234 is a columnar shape that extends in the Z-direction, for example, a shape of a cylinder.

Also, a connecting member 232 formed of polysilicon or the like is formed inside the interconnecting hole 222. The shape of the connecting member 232 is a columnar shape that is orthogonal to the Z-direction, and extends in an oblique direction that is oblique with respect to both the X-direction and the Y-direction. The connecting member 232 connects the lower end of one silicon pillar 231 and the lower end of another silicon pillar 231. When Seen from the Z-direction, the connecting members 232 are arranged along both the X-direction and the Y-direction. The connecting members 232 are electrically isolated from one another.

Furthermore, a pair of the silicon pillars 231 and the connecting member 232 formed in the same U-shaped hole 223 are integrally formed of the same material, for example, polysilicon, thus forming a single U-shaped silicon member 233. Thus, the U-shaped silicon member 233 is continuously formed without a break along the lengthwise direction. In addition, the silicon pillars 231 forming a pair belonging to the same U-shaped silicon member 233, that is, the silicon pillars 231 forming a pair connected to each other through the connecting member 232 are separated from each other in the X-direction and the Y-direction, and the silicon pillars 231 penetrate the different electrode films 214 from each other. In addition, a pair of the silicon pillars 234 connected to the pair of the silicon pillars 231 penetrate different select gate electrodes 217 from each other.

A plurality of bit lines BL and bBL are provided on the insulating film 218, extending in a direction (Y-direction) perpendicular to a direction where the select gate electrode 217 extends (X-direction). The bit lines BL and bBL are formed of stacked films of tungsten (W) and titanium nitride (TiN), for example. Instead of this, a metal film composed of aluminum (Al), copper (Cu) or the like, or stacked films including such a metal film may be used.

Each of the bit lines BL is disposed to pass through an area immediately above the silicon pillar 234 of each column arranged along the Y-direction, and is connected to the upper end of each of the silicon pillars 234. That is, silicon pillars 234 arranged in a line along the Y-direction are connected to the same bit line BL.

Also, as described above, the connecting member 232 connects a pair of silicon pillars 231 located at positions that are distant by one line or one column in the X-direction and the Y-direction.

Accordingly, the U-shaped silicon member 233 including the connecting member 232 is connected between a pair of bit lines BL adjacent to each other in the X-direction. In addition, all of the plurality of the connecting members 232 commonly connected to one bit line BL are commonly connected to another bit line BL.

In other words, the plurality of bit lines BL formed in the device 1 are grouped into two bit lines BL that are adjacent to each other, and the bit lines BL belonging to the identical group are connected to each other by the plurality of U-shaped silicon members 233. However, the bit lines BL belonging to the different groups are not connected by the U-shaped silicon members 233. Thus, the connecting members 232 connected between the bit lines BL belonging to the same group are arranged along a direction which the bit line extends, i.e., the Y-direction.

Also, in the above-described embodiment, an NAND type flash memory of three-dimensional type is explained as an example, but the present invention may be applied to a semiconductor device in which holes are formed in a stacked body with a certain interval.

What is claimed is:

1. A semiconductor device, comprising:
a stacked body where conductive films and insulating films are alternately laminated in a stacking direction;
a plurality of first holes formed in the stacked body and arranged in a zigzag manner in a planar direction of the stacked body; and
a plurality of second holes formed in the stacked body and arranged in a zigzag manner in a planar direction of the stacked body, and formed in positions sandwiched between the first holes,
the first holes and the second holes each have a substantially equal diameter,
the first holes and the second holes are different from each other in number thereof in a direction perpendicular to the stacking direction.

2. The semiconductor device according to claim 1, wherein the first hole and the second hole each have a different shape.

3. The semiconductor device according to claim 1, wherein the number of the first hole is larger than the number of the second hole.

4. A semiconductor device, comprising:
a stacked body where conductive films and insulating films are alternately laminated in a stacking direction;
a plurality of first holes formed in the stacked body and arranged in a first direction perpendicular to the stacking direction; and
a plurality of second holes formed in the stacked body and arranged away from the first holes in a second direction perpendicular to both the stacking direction and the first direction, wherein the first holes positioned at an edge of the first direction and the second holes positioned at an edge of the first direction are arranged in the second direction in a zigzag manner.

* * * * *